US012424509B2

(12) United States Patent
Samadiani et al.

(10) Patent No.: US 12,424,509 B2
(45) Date of Patent: Sep. 23, 2025

(54) COMPLIANT PAD SPACER FOR THREE-DIMENSIONAL INTEGRATED CIRCUIT PACKAGE

(71) Applicant: Google LLC, Mountain View, CA (US)

(72) Inventors: Emad Samadiani, Cypress, CA (US); Padam Jain, San Jose, CA (US); Yingshi Tang, Danville, CA (US); Sue Yun Teng, Belmont, CA (US); Nicholas Chao Wei Wong, San Jose, CA (US); Kieran Miller, Palo Alto, CA (US); Sudharshan Sugavanesh Udhayakumar, San Jose, CA (US)

(73) Assignee: Google LLC, Mountain View, CA (US)

( * ) Notice: Subject to any disclaimer, the term of this patent is extended or adjusted under 35 U.S.C. 154(b) by 513 days.

(21) Appl. No.: 17/885,022

(22) Filed: Aug. 10, 2022

(65) Prior Publication Data

US 2024/0055317 A1    Feb. 15, 2024

(51) Int. Cl.
  *H01L 23/34*     (2006.01)
  *H01L 23/00*     (2006.01)
  *H01L 23/367*    (2006.01)
  *H01L 23/498*    (2006.01)

(52) U.S. Cl.
  CPC .... *H01L 23/3677* (2013.01); *H01L 23/49816* (2013.01); *H01L 24/16* (2013.01); *H01L 2224/0401* (2013.01); *H01L 2224/16225* (2013.01)

(58) Field of Classification Search
  CPC ........... H01L 23/3677; H01L 23/49816; H01L 24/16; H01L 2224/0401; H01L 2224/16225; H01L 23/36; H01L 23/49827; H01L 23/5383; H01L 23/16; H01L 23/18; H01L 23/3107; H01L 23/367; H01L 23/373; H01L 23/46; H05K 3/3436;

(Continued)

(56) References Cited

U.S. PATENT DOCUMENTS 7,459,782 B1    12/2008  Li
7,724,527 B2     5/2010  Coico et al.
7,781,883 B2     8/2010  Sri-Jayantha et al.

(Continued)

FOREIGN PATENT DOCUMENTS

CN      114334949 A      4/2022
EP        4071797 A1    10/2022
WO    2021/219538 A1    11/2021

OTHER PUBLICATIONS

Extended European Search Report for European Patent Application No. 23156766.0 dated Jan. 24, 2024. 9 pages.

(Continued)

*Primary Examiner* — Theresa T Doan
(74) *Attorney, Agent, or Firm* — Lerner David LLP

(57) ABSTRACT

A compliant pad spacer utilized in a three-dimensional IC packaging is provided. The compliant pad spacer may be utilized to provide adequate support among the substrates or boards, such as packing substrates, interposers or print circuit broads (PCBs), so as to minimize the effects of substrate warpage or structural collapse in the IC packaging. In one example, the compliant pad spacer includes an insulating material, such as silicon-based polymer composites having ceramic fillers disposed therein.

13 Claims, 5 Drawing Sheets

(58) Field of Classification Search
CPC . H05K 2201/10378; H05K 2201/2036; H05K 1/141
USPC ......................................................... 257/720
See application file for complete search history.

(56) References Cited

U.S. PATENT DOCUMENTS

| | | |
|---|---|---|
| 8,299,608 B2 | 10/2012 | Bartley et al. |
| 8,526,186 B2 | 9/2013 | Yokoya et al. |
| 9,070,656 B2 | 6/2015 | Hooper et al. |
| 9,735,043 B2 | 8/2017 | Ho et al. |
| 10,553,522 B1 | 2/2020 | Canaperi et al. |
| 2005/0077080 A1 | 4/2005 | Dairo et al. |
| 2008/0253098 A1 | 10/2008 | Liu |
| 2011/0042784 A1* | 2/2011 | Edwards ............... H01L 23/293 257/532 |
| 2012/0006383 A1 | 1/2012 | Donnelly |
| 2012/0020040 A1 | 1/2012 | Lin et al. |
| 2014/0252579 A1 | 9/2014 | Chang et al. |
| 2015/0187675 A1 | 7/2015 | Tang et al. |
| 2019/0074237 A1 | 3/2019 | Beauchemin et al. |
| 2020/0105635 A1 | 4/2020 | Yu et al. |
| 2022/0051963 A1* | 2/2022 | England ............ H01L 23/49838 |

OTHER PUBLICATIONS

Extended European Search Report for Euorpean Patent Application No. 22154734.2 dated Aug. 1, 2022. 9 pages.

* cited by examiner

COMPLIANT PAD SPACER FOR THREE-DIMENSIONAL INTEGRATED CIRCUIT PACKAGE

BACKGROUND

Electronic components such as chip assemblies or integrated circuit (IC) dies are often used in electronic devices, such as tablets, computers, copiers, digital cameras, smart phones, control systems, and automated teller machines, among others. The demand for high-performance electronic devices has led to developments in electronic component designs. For instance, to increase the performance of an electronic component, the size of the electronic component is often decreased, while the number of integrated components, such as transistors, within the electronic component is increased.

Proper thermal management and cooling of the chip assemblies during operation has become increasingly important. Thermal energy generated during fabrication of the IC package often results in interface defects and damages. For example, due to a soldering reflow process when packaging the electronic components of the IC package, substrate solder reflow may lead to substrate warpage. Such substrate warpage may increase the difficulty of integrating multiple layers of substrates vertically for the high-density three-dimensional IC packaging.

SUMMARY

The present disclosure relates to a three-dimensional IC packaging comprising a compliant pad spacer that may be utilized for the three-dimensional IC packaging. The compliant pad spacer may be utilized to provide adequate support among the substrates or boards, such as interposers, packaging substrates or printed circuit broads (PCBs), so as to minimize the likelihood of substrate warpage or structural collapse in the IC packaging.

In one example, an integrated circuit (IC) package includes an IC die disposed on an interposer. A first plurality of solder balls is disposed between the interposer and a printed circuit board (PCB). A compliant pad spacer disposed between the interposer and the PCB.

In one example, a heat distribution device is disposed on the IC die. A thermal interface material (TIM) is disposed between the heat distribution device and the IC die. An additional compliant pad spacer is disposed between the heat distribution device and the IC die. An adhesive material is disposed between the additional compliant pad spacer and the IC die. In one example, an adhesive material is disposed between the compliant pad spacer and the PCB.

In one example, the compliant pad spacer is disposed on a bottom surface of corners of the interposer. The compliant pad spacer is disposed on a center portion of a side of the interposer. The compliant pad spacer is disposed vertically below the IC die on the PCB.

The compliant pad spacer is fabricated from an insulating material. The compliant pad spacer includes a polymer material. The compliant pad spacer includes silicon-based polymer composites having ceramic fillers disposed therein. The ceramic fillers include at least one of boron nitride, alumina, or rare earth elements. A second plurality of solder balls is disposed between the IC die and the interposer.

Another aspect of the technology is directed to a compliant pad spacer fabricated from an insulating material. The compliant pad spacer is configured to be disposed between two substrate boards in an IC package.

In one example, the compliant pad spacer includes silicon-based polymer composites having ceramic fillers disposed therein. The ceramic fillers include at least one of boron nitride, alumina, or rare earth elements. The compliant pad spacer includes a polymer material. The substrate boards include at least an interposer or a PCB. The compliant pad spacer is disposed around corners of at least one of the substrate boards.

DETAILED DESCRIPTION

The present disclosure relates to a three-dimensional IC packaging comprising a compliant pad spacer that may be utilized for the three-dimensional IC packaging. The compliant pad spacer may be utilized to provide adequate support among the substrates or boards, such as interposers, packaging substrates or printed circuit broads (PCBs), so as to minimize the likelihood of substrate warpage or structural collapse in the IC packaging. The compliant pad spacer may be selected from a material that provides sufficient rigidity for providing structural support among the boards or substrates in the IC packaging while also providing sufficient compliance and flexibility that avoids a concentration of stress at a point that would cause mechanical damage to the package or internal components of the package. Furthermore, the compliant pad spacer may also provide the benefit of electrical insulation to reduce a likelihood of short circuiting. In one example, the compliant pad spacer may be selected from an insulating material, such as a polymer material.

Figure 1A:
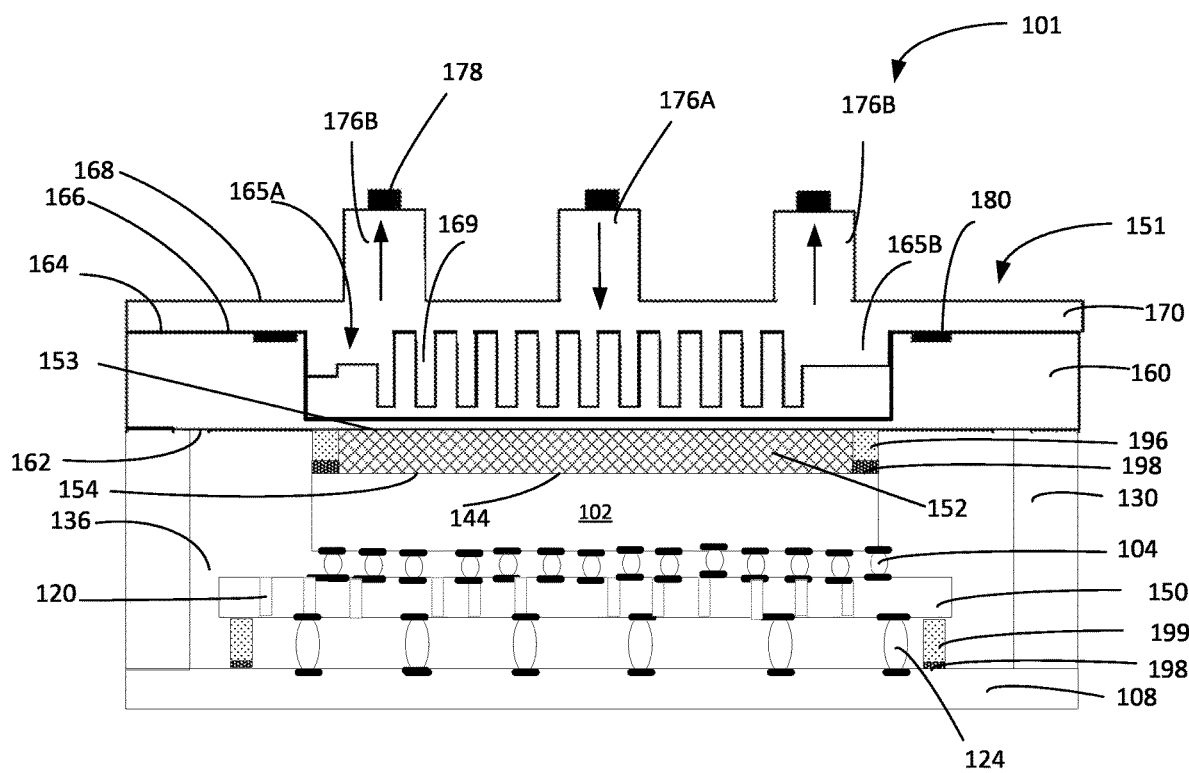
FIG. 1A depicts a cross-sectional view of an example of an IC package having a compliant pad spacer assembled therein in accordance with aspects of the disclosure.

FIG. 1A depicts a cross sectional-view of an IC package 101 including an IC die 102 formed on an interposer 150. In the example depicted in FIG. 1A, the IC package 101 includes at least one IC die 102, such as a core or main IC logic die. It is noted that one or more IC dies or memory device assemblies may be formed in close proximity to the IC die 102 or other suitable positions in the IC package 101. The IC die and the device assemblies disposed in the IC package 101 may be in any number or configuration. In one example, the IC die 102 utilized herein may be a graphics processing unit (GPU), custom application-specific integrated circuit (ASIC), or the like.

In one example, the IC die 102 is disposed on the interposer 150 through the plurality of connectors 104. In some examples, the connectors 104 may be solder balls. The connectors 104 may be gold, nickel, tin, copper, solder, aluminum, tungsten or other suitable conductive materials. The IC die 102 is electrically and/or physically connected to the interposer 150 through respective plurality of connectors (not shown) formed in the interposer 150.

The interposer 150 may have a plurality of through substrate vias (TSVs) 120 formed across a body of the interposer 150. The TSVs 120 may provide electrical connection channels to facilitate electrical connection of the IC die 102 to a printed circuit board (PCB) 108, a socket, or other such chip carrier disposed thereunder through a plurality of solder balls 124 arranged in a ball grid array (BGA). Other arrangements and connectors may include contacts arranged in a land grid array (LGA), connector pins arranged in a pin grid array (PGA), etc.

The interposer 150 and the PCB 108 may assist integrating and stacking multiple dies, components, devices, chip assemblies and chiplets in a vertical three-dimensional (3D) fashion. Such arrangement may improve the packaging density.

In some examples, additional packaging substrates may be disposed between the PCB 108 and the interposer 150 to assist integrating and stacking multiple dies, components, devices, chip assemblies and chiplets in a vertical three-dimensional (3D) fashion. The number of the additional package substrates disposed between the PCB 108 and the interposer 150 or between the interposer 150 and the IC die 102 may be in any number or in any configurations.

The numbers and positions of the connectors 104, TSVs 120, or solder balls 124 depicted in FIG. 1A are only for illustration and can be arranged in any manner based on the device performance designs, layouts and considerations.

A heat distribution device 151 overlies a thermal interface material (TIM) 152 in contact with the IC die 102 or other chip assemblies, if available. In one example, the heat distribution device 151 may include a plate lid 170 disposed on a plate base 160. The plate base 160 may include a bottom surface 162 in direct contact with the TIM 152 and an opposed top surface 164 in contact with the plate lid 170. Similarly, the plate lid 170 may include a bottom surface 166 facing the top surface 164 of the plate base 160, and an opposed top surface 168 from which an inlet 176A and one or more outlets 176B may extend. In other examples, the number and configuration of inlets and outlets can vary, such as there being two outlets directly adjacent to one another. The plate base 160 and the plate lid 170 may be manufactured using molding, machining, or similar processes.

The plate base 160 may include a plurality of thermally conductive fins 169, which help to facilitate cooling of heat distribution device 151. A first recess 165A and a second recess 165B are formed around the plurality of thermally conductive fins 169. The fins 169 may be longitudinal structures protruding away from the top surface 168 of the plate lid 170. The fins 169 may be integrally formed with the plate base 160 or with the plate lid 170 or may be attached to the plate base 160 by soldering, adhesive or the like. In this example, the fins 169 are integrally formed with the plate base 160.

The plate lid 170 overlies the plate base 160, such that the bottom surface 166 of plate lid 170 is directly adjacent to the top surface 164 of plate base 160. Although not required, O-rings 180 may be provided within an edge portion of the plate base 160 so as to form a seal between plate base 160 and plate lid 170. When joined together, the plate base 160 and the plate lid 170 enable fluids and/or gases, such as coolants, to flow into the heat distribution device 151 through the inlet 176A, and out of the heat distribution device 151 through the outlets 176B. The plate base 160 and the plate lid 170 may be formed from known heat dissipating materials, such as aluminum, copper, silver, metal alloys, etc. In the example depicted in FIG. 1A, the plate base 160 and plate lid 170 are formed from the same or different materials.

In one example, the thermal interface material (TIM) 152 may be manufactured from a material having a high thermal conductivity. The TIM 152 may have a first surface 153 in direct contact with the bottom surface 162 of plate base 160. The TIM may have a second surface 154 opposite and parallel to the first surface 153. The second surface 154 of the TIM 152 is in direct contact with the rear surface 144 of the IC die 102. The TIM 152 may be a high thermal conductivity material as well as having a low melting temperature. Suitable examples of TIM 152 include metal or graphite, such as nano Ag or Indium, but other high thermal conductivity TIM materials may be implemented. Additionally, in some implementations, an ultra-high thermal conductivity or low thermal conductivity material may be utilized for the TIM 152.

The TIM 152 may be provided in any desired form, such as liquid, solid, semi-solid, and the like. For example, the TIM 152 may be applied in liquid form, which will later be cured to form a soft elastomer. In some examples, the TIM 152 can be a grease, film, or solder.

A stiffener 130 extends between the heat distribution device 151 and the PCB 108. In one example, the stiffener 130 may be in ring or circular shape. The ring or circular shape of the stiffener 130 defines a center aperture 136 configured to surround the IC die 102. The stiffener 130 may be disposed between the PCB 108 and the plate base 160 of the heat distribution device 151. In one example, the size, shape and position of the center aperture 136 may be adapted based on circuitry of the underlying PCB 108 to be exposed through the center aperture 136 or the arrangement of the IC die 102 or the interposer 150 within the center aperture 136.

In one example, the stiffener 130 can be comprised of various materials. In one example, the stiffener 130 is formed from copper and is later plated with nickel (or similar metal) to promote adhesion to the PCB 108. An adhesive material (not shown) may be utilized at the interfaces between the PCB 108 and the plate base 160 of the heat distribution device 151.

In one example, a compliant pad spacer 199 may be disposed between the interposer 150 and the PCB 108 to provide mechanical and/or structural support therebetween. The compliant pad spacer 199 may be fabricated from a material that provides sufficient rigidity for providing structural and/or mechanical support between the interposer 150 and the PCB 108 in the IC packaging 101 while also provides sufficient compliance and flexibility that would not become stress concentration point to cause mechanical damage in the IC package 101. Furthermore, the compliant pad spacer 199 may also provide the benefit of electrical insulation to reduce likelihood of short circuiting. In one example, the compliant pad spacer 199 may be selected from an insulating material, such as a polymer material. In one example, the compliant pad spacer 199 is fabricated from silicon-based polymer composites, such as silicone sheet filled with ceramic fillers. Suitable examples of the ceramic fillers include boron nitride, alumina, rare earth elements, or the like. The material selected for fabricating the compliant pad spacer 199 may also be heat-resistant and may withstand temperature needed for solder reflow, without significant changes in the size and material properties of the compliant pad spacer 199. For example, the compliant pad spacer 199 may withstand repeated reflow of up to 250 degrees Celsius or more, such as 3 times for 5 minutes each time with time above liquidus approximately 60-90 seconds, without significant structural or thickness deformation.

During the soldering reflow process, the IC packaging 101 may undergo a thermal process for soldering. Without proper support or sufficient internal rigidity from the PCB 108, interposer 150, or other packaging substrate, the substrate warpage often occurs during and/or after cycles of the thermal process of the soldering process. Furthermore, the weight from the IC die 102 and/or from the interposer 150 may result in deformation of the solder balls 224.

Figure 2A:
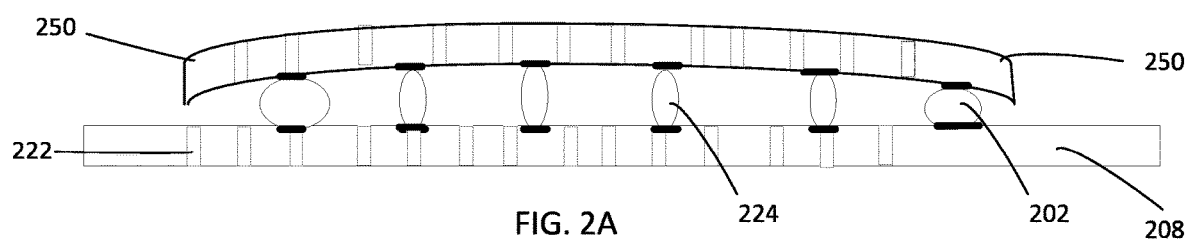
FIG. 2A depicts a cross-sectional view of a portion of an IC package without compliant pad spacers positioned therein.

FIG. 2A depicts an example of a portion of IC packaging with a deformed interposer 250. Such deformation may result in failure of solder height control that results in defects and damages in BGA IC package solder interconnection. Substrate warpage or package weight increase during the thermal reflow or assembling process may result in assembly defects and eventually lead to interconnection structure collapse. In the example depicted in FIG. 2A, the solder balls 202 located close to the ends of the interposer 150 tend to undergo relatively more thermal flux, compared to the solder balls 224 located at the center, resulting in the solder ball deformation, leading to substrate warpage. In some examples, the substrate and/or interposer 150 may also be deformed or softened during the soldering process, resulting in substrate warpage, increasing weight on the solder balls 202 located at the ends, resulting in solder ball deformation. Such deformation may eventually lead to integration and/or interconnection failure, interface defect and structural collapse.

Figure 2B:
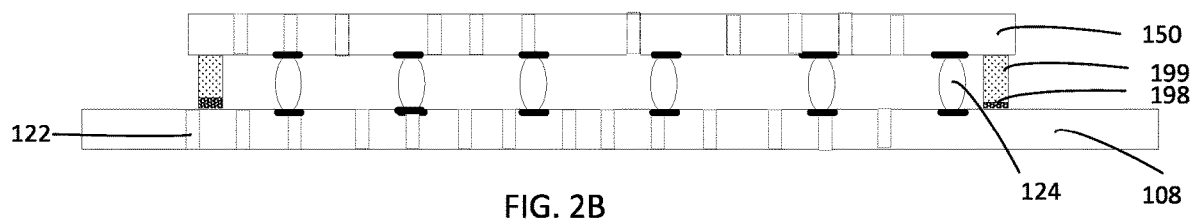
FIG. 2B depicts a cross-sectional view of a portion of an IC package with compliant pad spacers positioned therein.

Thus, by utilizing the compliant pad spacer 199, as shown in FIG. 2B, the compliant pad spacer 199, with or without the adhesive layer 198, may provide support to the interposer 150 so as to minimize the substrate warpage issue of the interposer 150, which may occur during the soldering process.

In some examples, the compliant pad spacer 199 may have a hardness range of less than 100 under Shore 00 measurement. The deformation range under load is less than 20% thickness deformation at 20 psi. The compliant pad spacer 199 may be formed from cutting a sheet of material of a predetermined thickness. In one example, the thickness of the compliant pad spacer 199 may be between 0.2 nm and about 0.5 nm. The compliant pad spacer 199 may also be cut to size and packaged in tape and reel to support automated pick and place operations.

Furthermore, a compliant pad spacer 196, similar to or same as the compliant pad spacer 199, may also be disposed between the base plate 160 and the IC die 102. The compliant pad spacer 196 utilized between the base plate 160 and the IC die 102 may reduce likelihood of solder TIM collapse so that the TIM bond line thickness (BLT) may be maintained and the BLT variation from corner to corner may be reduced. The material selected for fabricating the compliant pad spacer 196 may also be heat-resistant and may withstand temperature needed for solder TIM reflow, without significant changes in the size and material properties of the compliant pad spacer 196.

In some examples, an adhesive layer 198 may be utilized between the compliant pad spacer 199 and the PCB 108, or between the compliant pad spacer 196 and the IC die 102, to provide additional adhesion to bond the interface prior to soldering.

Figure 3A:
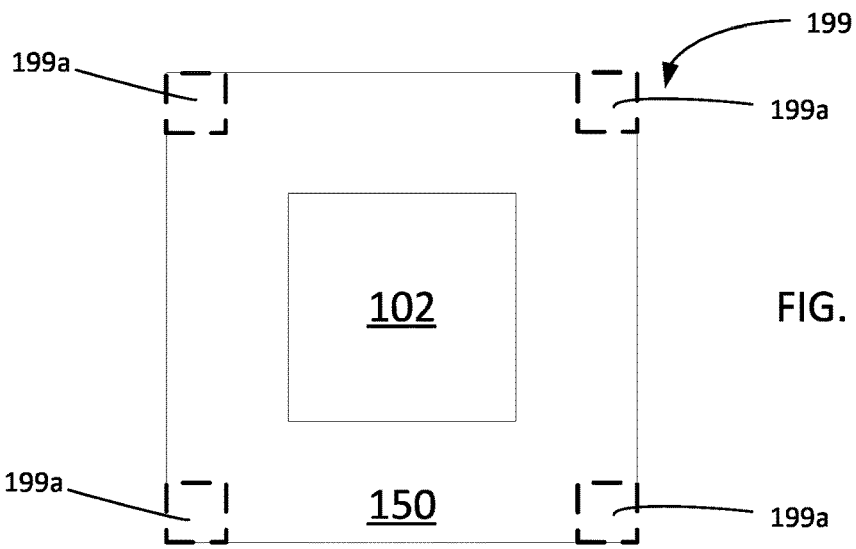
FIG. 3A-3C depict top views of an IC package having compliant pad spacers positioned at different locations of the IC package in accordance with aspects of the disclosure.
Figure 3B:
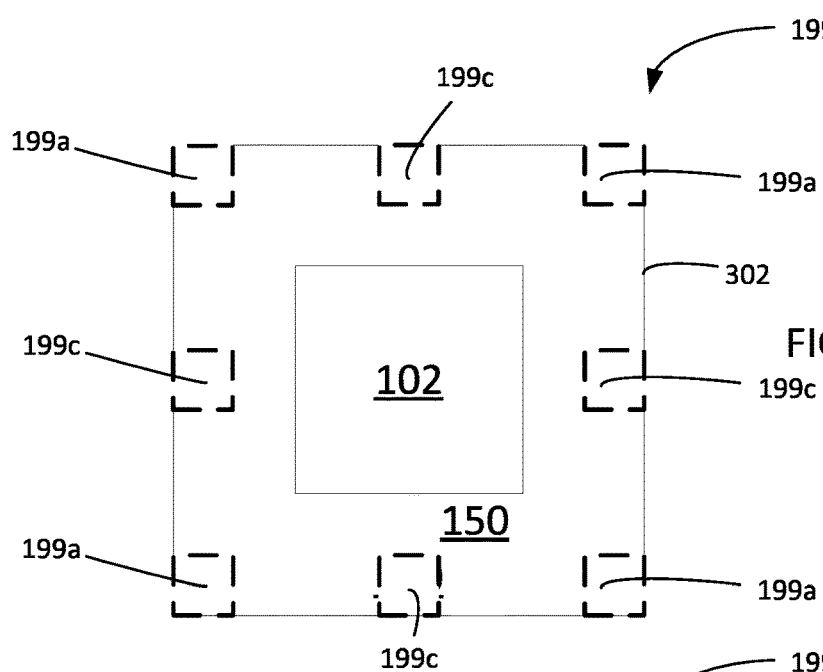
Figure 3C:
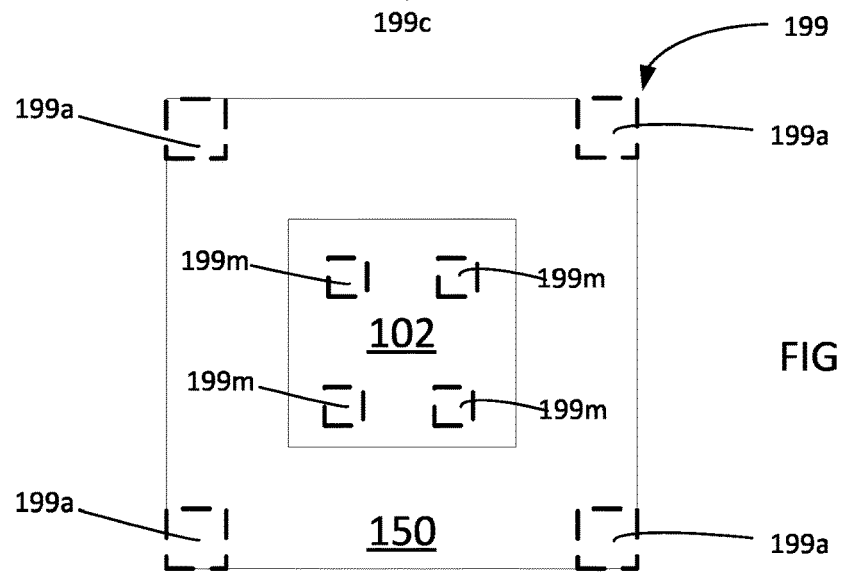

FIGS. 3A-3C depict different examples of different locations where the compliant pad spacers 199 may be located. Although the examples depicted in FIGS. 3A-3C depict that the compliant pad spacers 199 are located between the interposer 150 and the PCB (not shown), it is noted that the compliant pad spacers 199 may be located in any suitable locations, including between the IC die 102 and the base plate 160, or between the IC die 102 and the interposer 150, or between any die stack layers within the package.

In the example depicted in FIG. 3A, the compliant pad spacers 199, shown in dotted line as 199a invisible from the top view, may be located at corners under a bottom surface of the interposer 150 between the interposer 150 and the PCB 108. In the example depicted in FIG. 3B, the compliant pad spacers 199 may be located at corners 199a and center portions 199c of a side 302 of the interposer 150 between the interposer 150 and the PCB 108. In the example depicted in FIG. 3C, the compliant pad spacers 199 may be located at corners 199a as well as vertically under the IC die 102, shown as 199m, between the interposer 150 and the PCB 108. It is noted that the complaint pad spacers 199 may be in any shape or in any configurations located at anywhere suitable between the interposer 150 and the PCB 108, or between the IC die 102 and base plate 160 (or under the heat distribution device 151), or among different packaging substrates to provide the desired mechanical and/or structural support for the IC packaging.

Figure 1B:
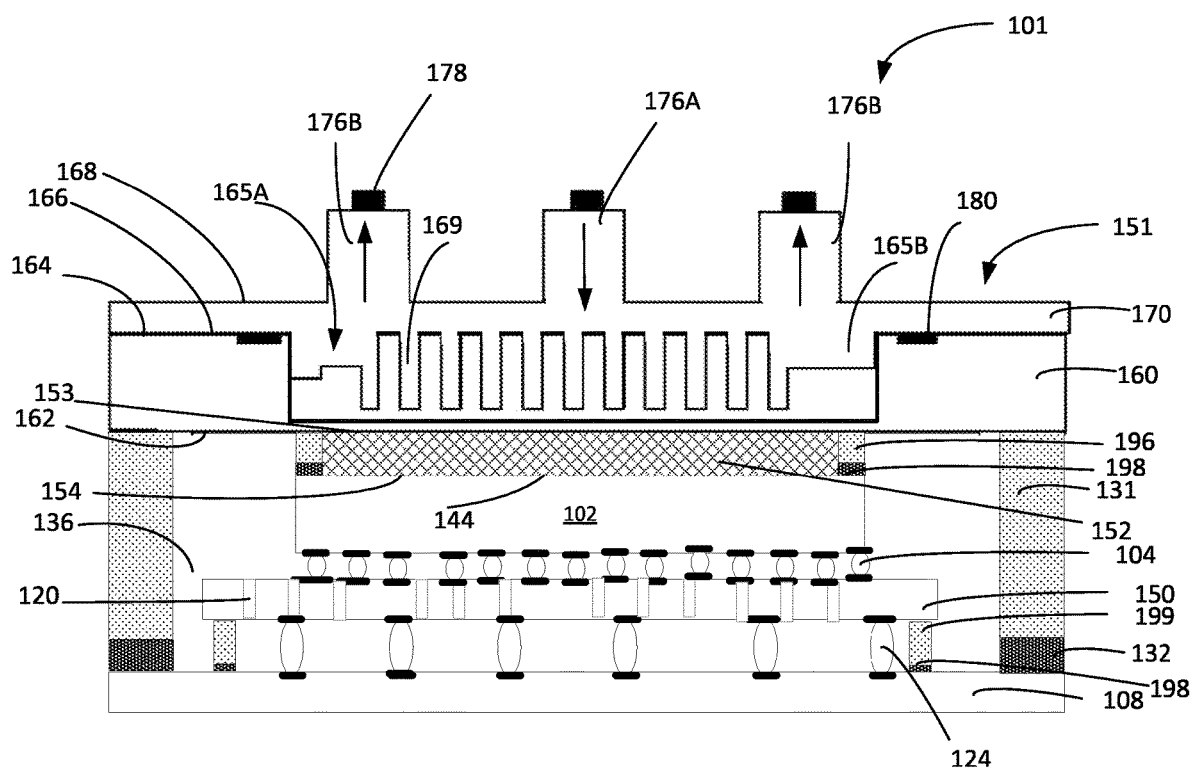
FIG. 1B depicts a cross-sectional view of another example of an IC package having a compliant pad spacer assembled therein in accordance with aspects of the disclosure.
Figure 4:
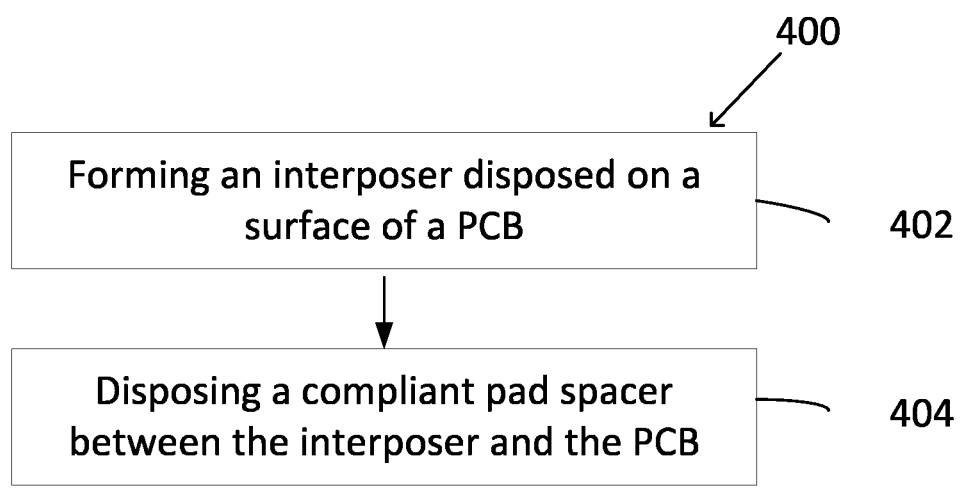
FIG. 4 depicts a flow diagram for manufacturing an IC package including an IC die including a temperature control element formed therein in accordance with aspects of the disclosure.

FIG. 4 depicts a flow diagram for manufacturing and packaging electronic components in an IC package, such as the IC package 101 depicted in FIG. 1A-1B including the compliant pad spacers 199 disposed therein in accordance with aspects of the disclosure. Such method may be performed using suitable manufacturing processes, including depositing, etching, lithography, polishing, soldering, or any suitable techniques. It should be understood that the operations involved in the following methods need not be performed in the precise order described. Rather, various operations may be handled in a different order or simultaneously, and operations may be added or omitted.

Referring to FIG. 4, in block 402, an interposer is disposed on a surface of a PCB through a plurality of solder balls disposed on the PCB.

In block 404, a compliant pad spacer is disposed between the interposer and the PCB. It is noted that the compliant pad spacer may be disposed on the PCB prior to placing the interposer on the PCB through the plurality of solder balls disposed on the PCB.

It is noted that the compliant pad spacer may also be disposed on the IC die and then followed with disposing the TIM along the top surface of the IC die parallel to the compliant pad spacer.

Thus, a compliant pad spacer utilized in a three-dimensional IC packaging is provided. The compliant pad spacer may be utilized to provide adequate support among the substrates or boards, such as interposers or print circuit broads (PCBs), so as to minimize the effects of substrate warpage or structural collapse in the IC packaging. The compliant pad spacer may be disposed in the IC packaging with or without an adhesive layer inserted between the compliant pad spacer and an interposer or a PCB. The compliant pad spacer may be selected from a material that provides sufficient rigidity for providing structural support among the boards or substrates in the IC packaging while also providing sufficient compliance and flexibility that would not become a stress concentration point to cause mechanical damage in package. Furthermore, the compliant pad spacer may also provide the benefit of electrical insulation to reduce likelihood of short circuiting with the desired heat resistance.

Although the technology herein has been described with reference to particular examples, it is to be understood that these examples are merely illustrative of the principles and applications of the present technology. It is therefore to be understood that numerous modifications may be made and that other arrangements may be devised without departing from the spirit and scope of the present technology as defined by the appended claims.

The invention claimed is:

1. An integrated circuit (IC) package, comprising:
   an IC die disposed on an interposer;
   a first plurality of solder balls disposed between the interposer and a printed circuit board (PCB); and
   one or more compliant pad spacers disposed between the interposer and the PCB, wherein the one or more compliant pad spacers are separately positioned at a respective corner of a bottom surface of the interposer.

2. The IC package of claim 1, further comprising:
   a heat distribution device disposed on the IC die.

3. The IC package of claim 2, further comprising:
   a thermal interface material (TIM) disposed between the heat distribution device and the IC die.

4. The IC package of claim 3, further comprising:
   an additional compliant pad spacer disposed between the heat distribution device and the IC die.

5. The IC package of claim 4, further comprising:
   an adhesive material disposed between the additional compliant pad spacer and the IC die.

6. The IC package of claim 1, further comprising:
   an adhesive material disposed between the compliant pad spacer and the PCB.

7. The IC package of claim 1, wherein the compliant pad spacer is disposed on a center portion of a side of the interposer.

8. The IC package of claim 1, wherein the compliant pad spacer is disposed vertically below the IC die on the PCB.

9. The IC package of claim 1, wherein the compliant pad spacer is fabricated from an insulating material.

10. The IC package of claim 1, wherein the compliant pad spacer includes a polymer material.

11. The IC package of claim 1, wherein the compliant pad spacer includes silicon-based polymer composites having ceramic fillers disposed therein.

12. The IC package of claim 11, wherein the ceramic fillers include at least one of boron nitride, alumina, or rare earth elements.

13. The IC package of claim 1, further comprising:
    a second plurality of solder balls disposed between the IC die and the interposer.

* * * * *